(12) United States Patent
Schmidt et al.

(10) Patent No.: US 8,169,306 B2
(45) Date of Patent: May 1, 2012

(54) TOUCH PANEL ASSEMBLY WITH HAPTIC EFFECTS AND METHOD OF MANUFACTURING THEREOF

(75) Inventors: Robert Schmidt, Livonia, MI (US); Charles B. Banter, Northville, MI (US)

(73) Assignee: Methode Electronics, Inc.

( * ) Notice: Subject to any disclaimer, the term of this patent is extended or adjusted under 35 U.S.C. 154(b) by 299 days.

(21) Appl. No.: 12/408,824

(22) Filed: Mar. 23, 2009

(65) Prior Publication Data

US 2010/0238053 A1    Sep. 23, 2010

(51) Int. Cl.
*G08B 6/00* (2006.01)
(52) U.S. Cl. ............ 340/407.2; 340/539.26; 340/426.25
(58) Field of Classification Search .............. 340/407.1, 340/407.2, 426.24, 426.25, 426.34, 463–464, 340/525, 539.22, 539.26, 392.2
See application file for complete search history.

(56) References Cited

U.S. PATENT DOCUMENTS

| | | | |
|---|---|---|---|
| 6,031,524 A | 2/2000 | Kunert | |
| 6,111,577 A * | 8/2000 | Zilles et al. ................... | 715/701 |
| 6,429,846 B2 | 8/2002 | Rosenberg et al. | |
| 7,148,875 B2 | 12/2006 | Rosenberg et al. | |
| 7,215,329 B2 | 5/2007 | Yoshikawa et al. | |
| 7,245,048 B2 | 7/2007 | Fujii et al. | |
| 7,253,723 B2 * | 8/2007 | Lindahl et al. ................ | 340/438 |
| 7,416,561 B2 * | 8/2008 | Worst et al. .................. | 623/6.12 |
| 7,567,232 B2 * | 7/2009 | Rosenberg .................... | 345/156 |
| 7,834,857 B2 * | 11/2010 | Prados .......................... | 345/173 |
| 2002/0033795 A1 | 3/2002 | Shahoian et al. | |
| 2005/0253643 A1 | 11/2005 | Inokawa et al. | |
| 2008/0062145 A1 * | 3/2008 | Shahoian et al. ............. | 345/173 |
| 2009/0174672 A1 | 7/2009 | Schmidt | |

FOREIGN PATENT DOCUMENTS

| | | |
|---|---|---|
| EP | 0419145 A1 | 3/1991 |
| JP | 2006119849 A | 5/2006 |
| JP | 2006215738 A | 8/2006 |
| JP | 2007034954 A | 2/2007 |
| KR | 200258353 A | 4/2004 |
| WO | WO-0108132 A1 | 2/2001 |

* cited by examiner

*Primary Examiner* — Daniel Previl (57) ABSTRACT

A system with haptic effects includes a first surface, a second surface with a flexible arm portion, a coupling that couples the flexible arm portion to the first surface, and a haptic effect generator attached to the first surface. The flexible arm portion includes a coupling portion, and the coupling is received in the coupling portion. The haptic effect generator causes movement of the first surface relative to the second surface, and the flexible arm limits the movement of the first surface and elastically returns the first surface substantially to its original position relative to the second surface.

14 Claims, 13 Drawing Sheets

TOUCH PANEL ASSEMBLY WITH HAPTIC EFFECTS AND METHOD OF MANUFACTURING THEREOF

FIELD OF THE INVENTION

The invention relates to systems with haptic effects. In particular, the invention relates to touch panels with haptic feedback.

BACKGROUND OF THE INVENTION

In many present day situations, a person has to adjust various functions and operations of several different electrical and mechanical devices. For example, the driver of a car while driving may have to adjust or control a heating and cooling system, an audio entertainment system, windows, locks, a cruise control system and possibly a navigation system. Conventionally, the user would use buttons, switches, knobs, and other similar mechanical controls to adjust the various functions or operations of these devices. However, with the increased number of controllable devices, along with the increased complexity of each individual device, a person may be required to provide many different inputs through several different buttons, switches, knobs, and other mechanical controls.

To replace the many, separate, and different mechanical controls and to simplify and enhance the control of these many devices, a single aggregate instrument that can relay commands to several devices is often employed, such as a touch panel. By using a touch panel, the user can adjust several different devices by interacting with a hierarchical menu shown on the touch panel to select a particular device and to select a particular function associated with that device.

The touch panel replaces mechanical buttons and switches but typically does not provide the same tactile feedback as a mechanical button or switch. Thus, to enhance the user's interaction with the touch panel, feedback to the user may be provided through visual, auditory, kinesthetic, and/or tactile cues. Kinesthetic feedback, such as active and resistive force feedback, and tactile feedback, such as vibration, texture, and heat, is collectively referred to as "haptic feedback." Haptic feedback can be used to convey physical force sensations to the user, and generally, the physical forces simulate actuating a mechanical button or switch and provide the user with an indication that the user's input has been accepted.

Conventional haptic feedback can be provided by linear actuators, piezoelectric films, or oscillating mass actuators. Linear actuators provide linear motion using an electromagnetic actuator and simulate a push response. In one conventional system, four individual linear actuators are placed at the four corners of a touch panel. Based on the user's interaction with the touch panel, the four individual actuators will simultaneously impart a slight linear motion to the touch panel so that the user perceives a push response. However, conventional haptic feedback systems using four individual linear actuators are costly to manufacture and difficult to manufacture because such systems require precise alignment of the individual linear actuators to each other for proper movement. Also, linear actuators may not provide an audible feedback that the user's input has been received or accepted.

Haptic feedback is also provided by using piezoelectric films. Piezoelectric films are typically placed over a touch panel and vibrate in response to a touch by the user. Thus, it vibrates or flexes the surface of the touch panel. However, conventional haptic feedback systems using piezoelectric film that vibrate or flex a surface leads to premature failure due to surface stress cracks or subsurface solder joint failures. Also, for certain applications, vibrating the entire surface of a touch panel is not practical.

Furthermore, haptic feedback is also provided by oscillating mass actuators. Oscillating mass actuators shake a surface, such as a touch panel, or in some cases, the entire assembly. However, the entire mass of a touch panel assembly cannot be vibrated or pulsed with conventional mounting and assembly systems. Also, similar to systems using piezoelectric films, in certain applications, it may not be practical to vibrate or move an entire touch panel system.

Thus, there is a need for a system that provides haptic feedback at reduced cost, simplifies manufacturing of devices with haptic feedback, and reduces premature component failure.

SUMMARY OF THE INVENTION

Accordingly, an object of the invention is to provide a haptic feedback at reduced cost. Another object is to facilitate manufacturing of devices with haptic feedback. Yet another object is to prevent premature failure due to haptic feedback.

One embodiment of the invention provides a system with haptic effects. The system includes a first surface, a second surface with a flexible arm portion, a coupling that couples the flexible arm portion to the first surface, and a haptic effect generator attached to the first surface. The flexible arm portion includes a coupling portion, and the coupling is received in the coupling portion. The haptic effect generator causes movement of the first surface relative to the second surface, and the flexible arm limits the movement of the first surface and elastically returns the first surface substantially to its original position relative to the second surface.

Another embodiment of the invention provides a method of manufacturing a system with haptic effects. The method includes the steps of providing a surface, placing a flexible arm portion on the surface, placing a coupling portion on the flexible arm portion, joining the coupling portion to another surface, and placing a haptic effect generator on the other surface.

Other objects, advantages and salient features of the invention will become apparent from the following detailed description, which, taken in conjunction with the annexed drawings, discloses a preferred embodiment of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Referring to FIGS. 1 to 11, the invention provides a touch panel assembly 100 with haptic effects and a method of manufacturing the touch panel assembly 100 with haptic effects. The touch panel assembly 100 provides haptic feedback when the user manipulates an input device 116.

Referring to FIGS. 1 and 2A-2D, the touch panel assembly 100 according to one preferred embodiment is shown. In the depicted embodiment, the touch panel assembly 100 can be installed into the dashboard of an automobile, however the invention is not limited to only touch panel assemblies 100 of an automobile. The invention is applicable to touch panel assemblies 100 for other applications. However, in the interest of simplifying and facilitating the description of the invention without intending to limit the invention, an exemplary embodiment where the touch panel assembly 100 is used in an automobile is described.

The touch panel assembly 100 includes, at least, a bezel 102, a sensor circuit board 104, an interface circuit board 106, a retainer bracket 108, a haptic effect generator 110, a rear cover 112, and one or more mountings 114, Terms such as "front," "forward," "back," "rear," "to the right," "to the left," and other similar terms are not intended to limit the invention. Instead, such terms are used to facilitate describing the positions of components relative to other components. As shown in the figures, the bezel 102, the sensor circuit board 104, the interface circuit board 106, and the rear cover 112 are disposed in layers with the bezel 102 and the rear cover 112 substantially encasing the sensor circuit board 104, the interface circuit board 106, the retainer bracket 108, and the haptic effect generator 110 to form the touch panel assembly 100.

The bezel 102 provides a surface that a user interacts with to provide an input to the touch panel assembly 100. The bezel 102 can include at least one input device 116. The input device 116 can be pressure sensitive through resistive sensors, electrically sensitive through capacitive sensors, acoustically sensitive through surface acoustic wave sensors, photo sensitive through infrared sensors, and the like. In the embodiment shown, the input device 116 can be depressed by the user. In other embodiments, the input device 116 can be a switch, rotary knob, pull switch, or some other input device that can be implemented with the touch panel assembly 100. Furthermore, the bezel 102 can be marked with words, letters, numbers, figures, or other indicia to indicate the function of the input device. The bezel 102 can be made from any suitably rigid material, including, but not limited to, plastics, metals, leathers, glass, wood, combinations of the aforementioned, and other similar materials. The choice of material also being suitable for the type of input device 116 used with the touch panel assembly 100. For example, in the embodiment shown, plastics are used because they have the necessary elastic flexibility that can be used with a depressible input device 116.

Also, although the depicted embodiment has a bezel 102, in other embodiments, the bezel 102 can be replaced with a touch screen, one or more touch switches, one or more touch pads, and other similar devices that can accept an input from a user. The touch screen, touch switches, touch pads, and the like can be made transparent or translucent and placed over a display device that generates graphical images. The display device can be a liquid crystal display, a plasma display, an electroluminescent display, a light emitting diode display, or some other device for displaying images, such that the user responds to images to provide an input to the touch panel assembly 100 instead of the indicia of a bezel 102.

Figure 1:
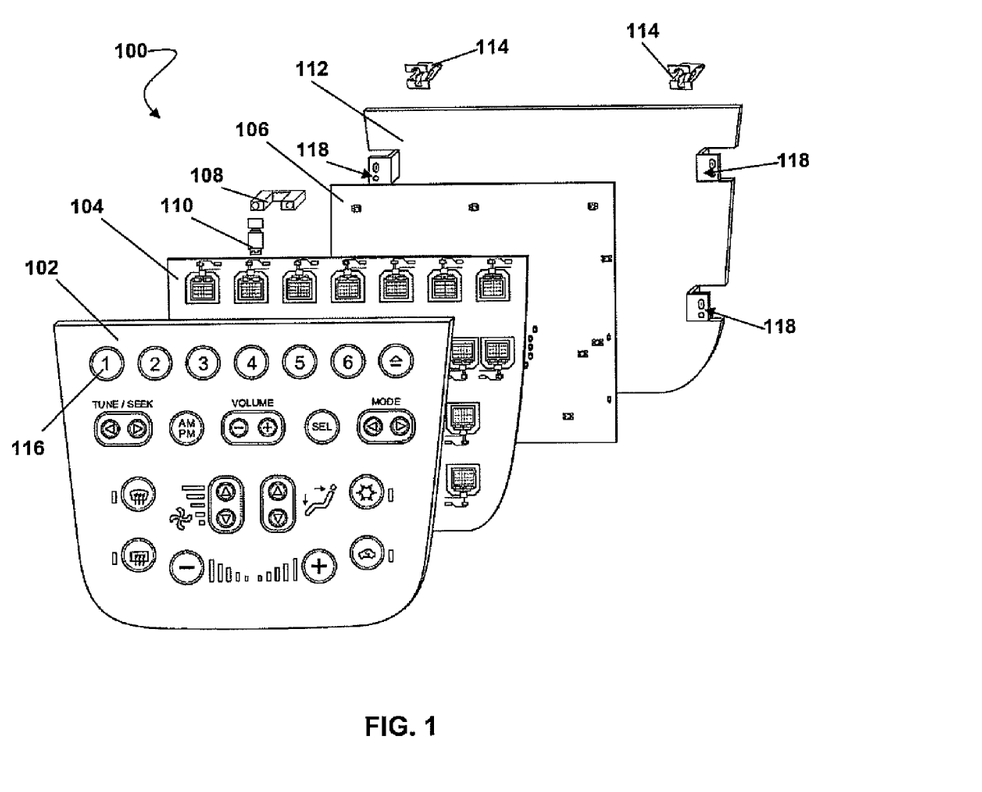
FIG. 1 is an exploded perspective view of a touch panel assembly with haptic effects according to an exemplary embodiment of the invention.
Figure 2A:
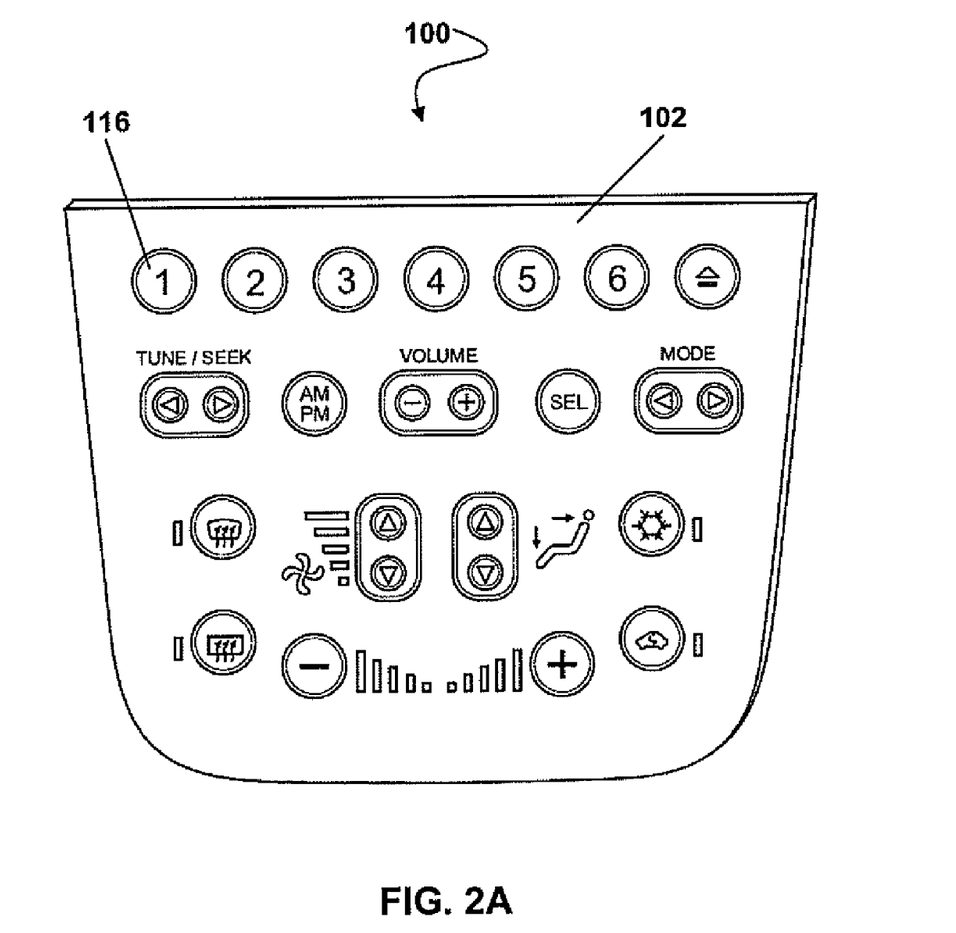
FIG. 2A is a front elevational view of the touch panel assembly illustrated in FIG. 1.
Figure 2B:
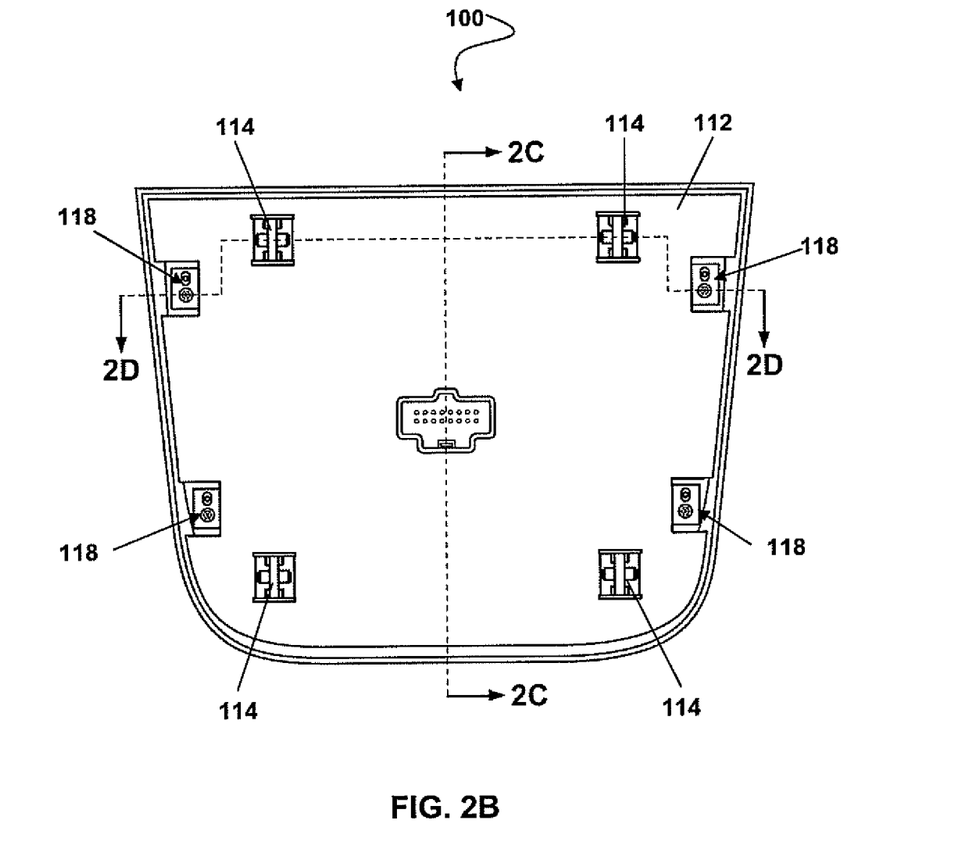
FIG. 2B is a rear elevational view of the touch panel assembly illustrated in FIG. 1.
Figure 2C:
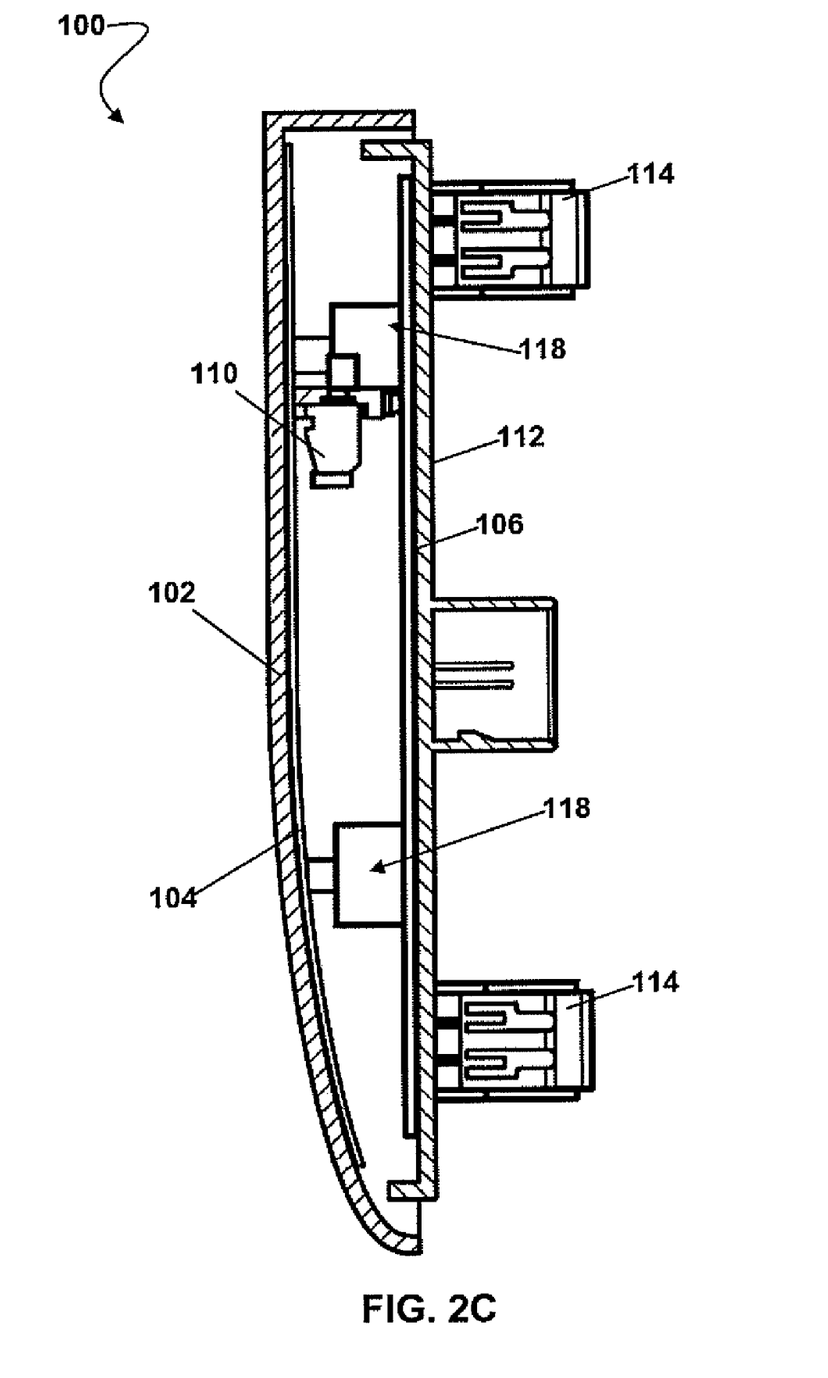
FIG. 2C is a side elevational sectional view of the touch panel assembly illustrated in FIG. 1.
Figure 2D:
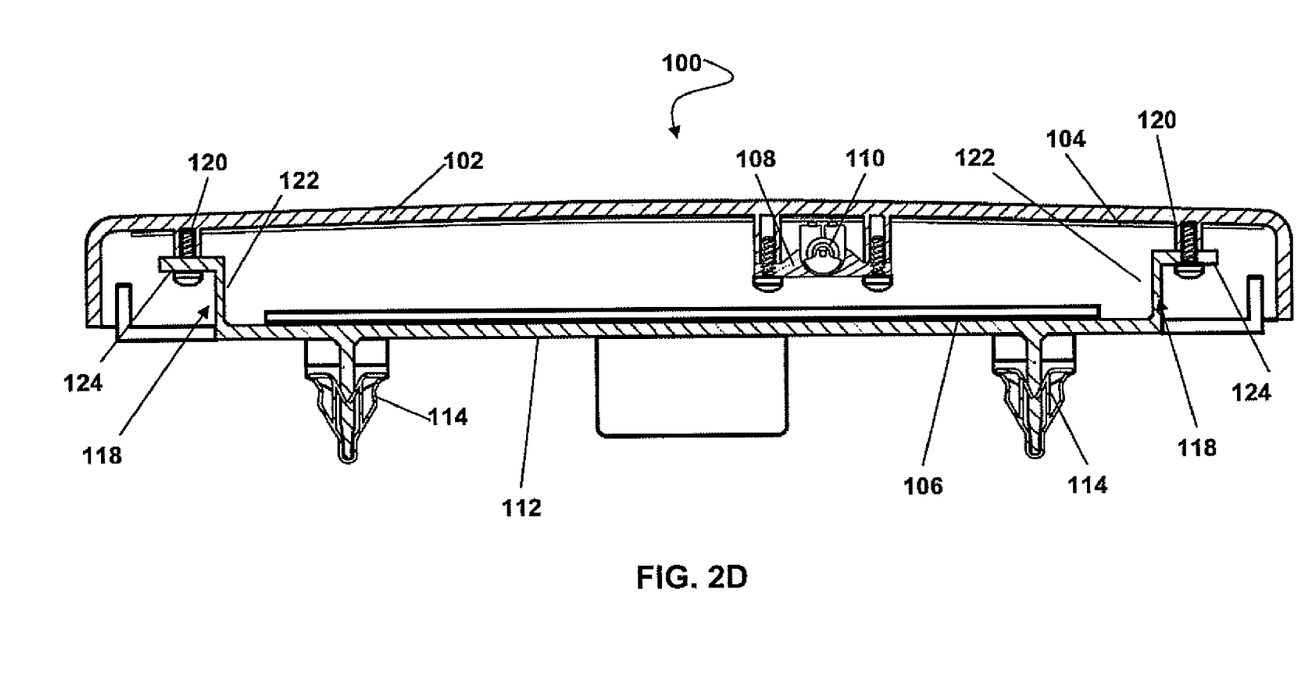
FIG. 2D is a top plan sectional view of the touch panel assembly illustrated in FIG. 1.

Disposed behind the bezel 102 is the sensor circuit board 104. The sensor circuit board 104 includes the corresponding and necessary electrical components, electronics, mechanical components, and other devices that interact with the input device 116 to transform the user's input into an electrical, electro-mechanical, or mechanical signal suitable for use by the touch panel assembly 100. The sensor circuit board 104 can be made from a suitable material that provides mechanical support and a mounting surface for the electrical components, electronics, mechanical components, and other devices necessary for the input device 116. As best seen in FIGS. 2C and 2D, the sensor circuit board 104 of the depicted embodiment is disposed immediately adjacent to a surface of the bezel 102 opposite the surface with the input devices 116. Also, in the embodiment shown, the sensor circuit board 104 is a dielectric substrate with electronics on the substrate to transform the actuating of an input device 116 into an electrical signal.

The interface circuit board 106 is disposed adjacent to and to the rear of the sensor circuit board 104. In other embodiments, the interface circuit board 106 and the sensor circuit board 104 can be formed as a single circuit board. Alternatively, in other embodiments, the touch panel assembly 100 can include more than one sensor circuit board 104 and more than one interface circuit board 106. The interface circuit board 106 includes electrical components, electronics, mechanical components, and other devices that transform or relay the signal received from the sensor circuit board 104 to the controlled device, such as a component of an audio entertainment system or a heating and cooling system. Similar to the sensor circuit board 104, the interface circuit board 106 can be made from a suitable material that provides mechanical support and a mounting surface for the electrical components, electronics, mechanical components, and other necessary devices. As best seen in FIGS. 2C and 2D, the interface circuit board 106 of the depicted embodiment is disposed immediately adjacent to a surface of the rear cover 112. Also, in the embodiment shown, the interface circuit board 106 is a dielectric substrate with electronics on the substrate to transform or relay the electric signal from the sensor circuit board 104 to a device to be controlled by the touch panel assembly 100.

Figure 3:
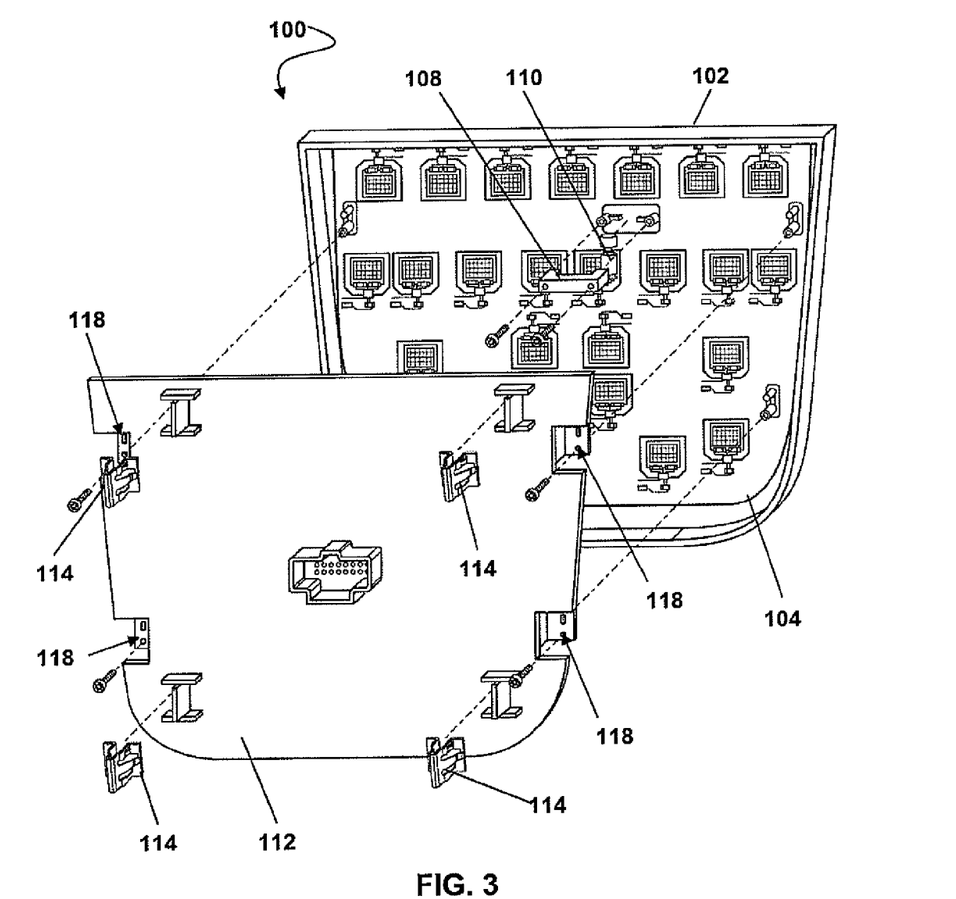
FIG. 3 is an exploded rear perspective view of the touch panel assembly illustrated in FIG. 1.

Turning to FIGS. 2C, 2D, and 3, the rear cover 112 provides protection and mechanical support. The rear cover 112 can be made from any suitable rigid material, such as, but not limited to, plastics, metals, leathers, glass, wood, combinations of the aforementioned, and other similar materials. In the embodiment shown, the rear cover 112 joins with the bezel 102 to substantially encompass the sensor circuit board 104, the interface circuit board 106, the retainer bracket 108, and the haptic effect generator 110 to form the touch panel assembly 100.

As best shown in FIGS. 2C and 2D, the rear cover 112 is coupled to the bezel 102 by at least one flex arm assembly 118. The flex arm assembly 118 includes, at least, a coupling 120 to couple the bezel 102 to the rear cover 112 and a flexible arm portion 122. The flexible arm portion 122 allows the bezel 102 to elastically move relative to the rear cover 112. The flexible arm portion 122 elastically bends when the haptic effect generator 110 is actuated. In the embodiment shown, the coupling 120 is a screw, and the flexible arm portion 122 is a portion of the rear cover 112 formed substantially perpendicular to the rear cover 112. The flexible arm portion 122 also has a coupling portion 124 extending from it to engage the coupling 120. Thus, when an input device 116 on the bezel 102 is actuated, a signal is sent to the haptic effect generator 110. The signal sent to the haptic effect generator 110 causes it to impart a slight movement to the bezel 102 which informs the user that his manipulation of the input device 116 is being processed by the touch panel assembly 100. The movement caused by the haptic effect generator 110 is limited by the flexible arm portion 122 of the flex arm assembly 118, and the flexible arm portion 122 elastically returns the bezel 102 to substantially its original position relative to the rear cover 112, i.e., the position before the movement caused by the haptic effect generator 110.

Furthermore, the rear cover 112 has at least one mounting 114 to couple the touch panel assembly 100 to another structure 126. In the embodiment shown, the rear cover 112 provides a surface for mountings 114 to install the touch panel assembly 100 into the dashboard 126 of an automobile. The mountings 114 can be screws, nuts and bolts, rivets, press fittings, and other similar couplings. In the depicted embodiment, the mountings 114 are spring clips. Because the rear cover 112 has at least one flex arm assembly 118 that couples to the bezel 102 and at least one mounting 114 that couples the touch panel assembly 100 to another structure, the rear cover 112 can provide a flex arm assembly 118 in a conventional control panel assembly, can be adapted for use with a wide variety of haptic effect generators 110 thus optimizing the balance between cost and performance, and provides a single component transition between the fixed structure 126, such as the dashboard, and the moving surface, such as the bezel 102.

As best shown in FIG. 2D, the retainer bracket 108 couples the haptic effect generator 110 to the bezel 102. The haptic effect generator 110 provides a haptic effect in response to the user manipulating an input device 116 of the bezel 102. The haptic effect generator 110 can provide linear motion, circular motion, or non-linear motion. The motion can simulate a response to a push of a mechanical button or other similar mechanical input devices. The motion provided by the haptic effect generator 110 can be caused by several different methods, such as, but not limited to, electrical, electromechanical, hydraulic, pneumatic, or mechanical. The haptic effect generator 110 can be active or passive. Active actuators include, for example, linear current control motors, stepper motors, pneumatic/hydraulic active actuators, voice coil actuators, and other similar devices. Passive actuators include, but are not limited to, dissipative passive actuators, linear magnetic particle brakes, linear friction brakes, pneumatic/hydraulic passive actuators, and other similar devices. Also, the haptic effect generator 110 can be, but not limited to, a solenoid, a linear resonance actuator, an eccentric rotary mass motor, a linear actuator such as the commercially available "Immersion A100," piezoelectric film, combinations of the aforementioned, or any other device that can produce a haptic effect.

To simplify the description without intending to limit the invention, the haptic effect generator 110 is described as providing a linear motion. In the embodiment shown in FIGS. 1-6, the haptic effect generator 110 includes an eccentric rotary mass, while in the embodiment shown in FIGS. 9-11, the haptic effect generator 410 includes a linear actuator.

Figure 4:
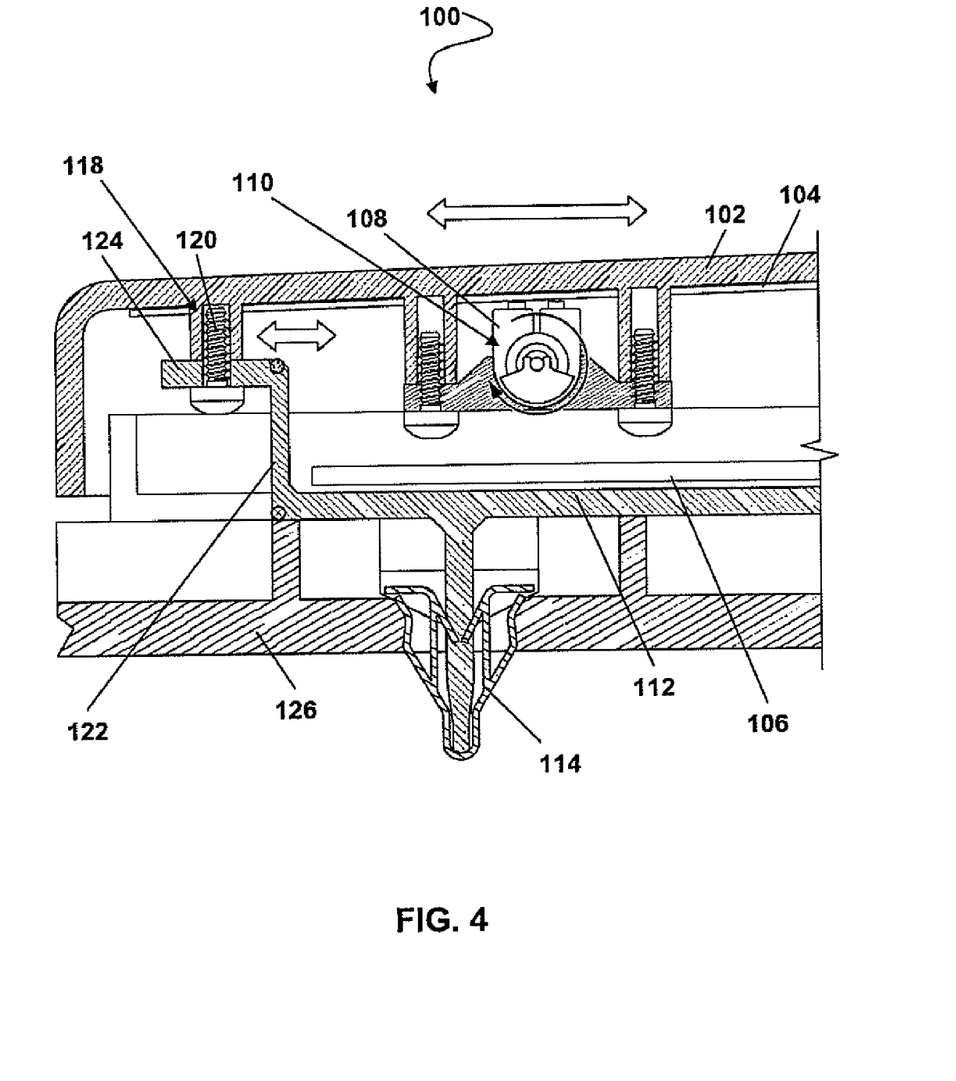
FIG. 4 is a partial sectional view in detail of the touch panel assembly illustrated in FIG. 1.
Figure 5:
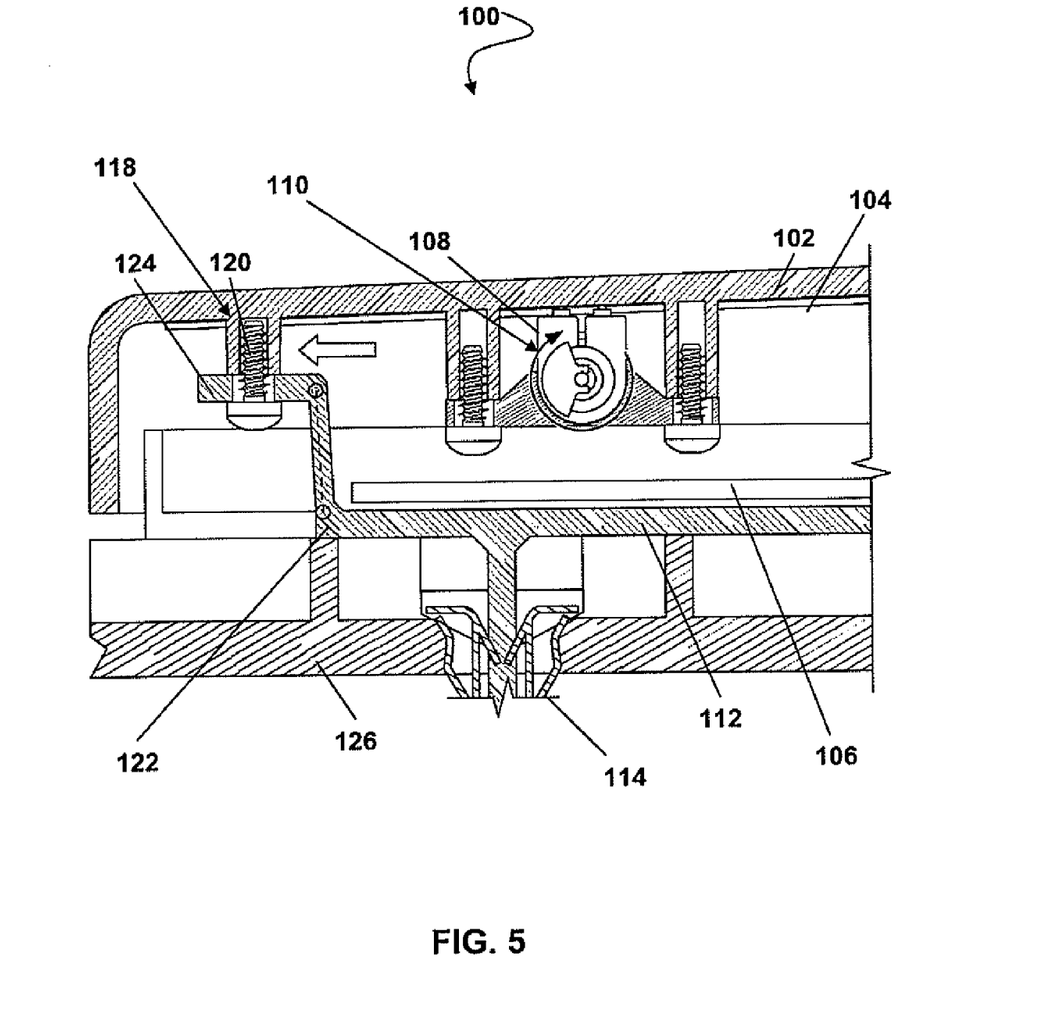
FIG. 5 is a partial sectional view in detail of the touch panel assembly illustrated in FIG. 1.
Figure 6:
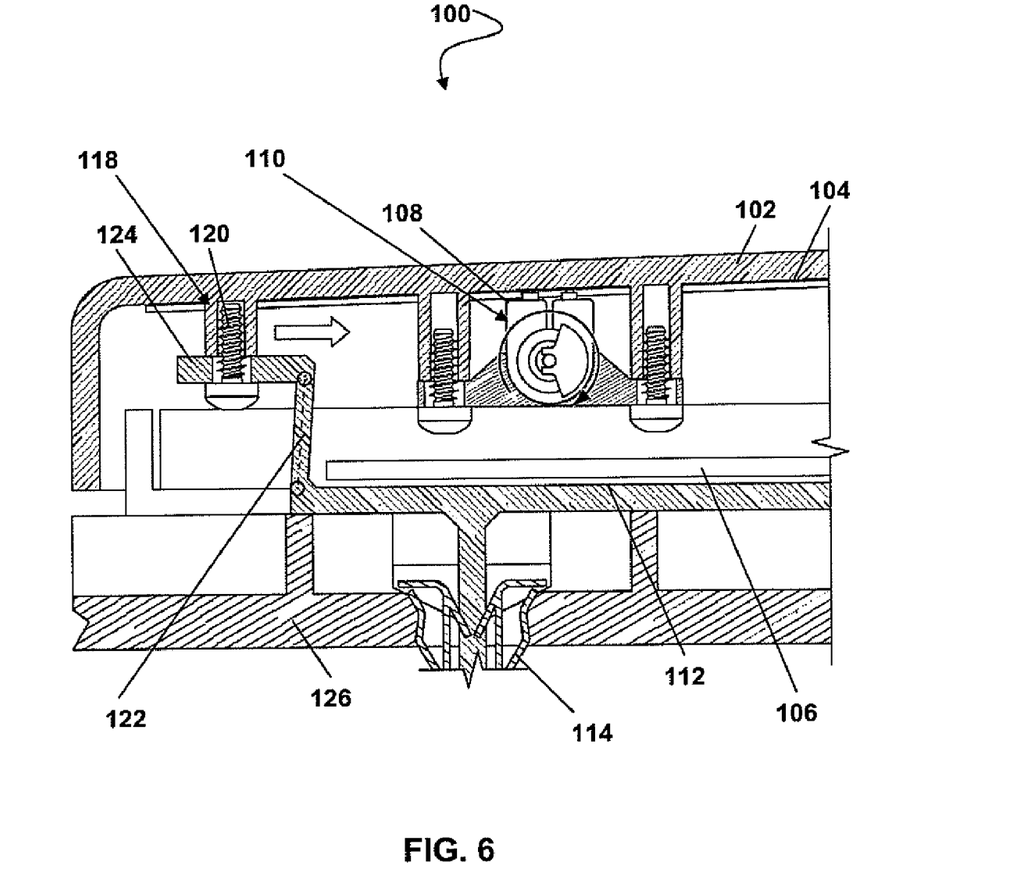
FIG. 6 is a partial sectional view in detail of the touch panel assembly illustrated in FIG. 1.

Referring to FIGS. 4-6, a sectional view of the touch panel assembly 100 is shown with the retainer bracket 108, the haptic effect generator 110, one flex arm assembly 118, and one mounting 114 shown in close proximity to each other to explain the operation of the invention. In the embodiment shown, the haptic effect generator 110 has an eccentric rotary mass. Turning to FIG. 4, the eccentric rotary mass of the haptic effect generator 110 is beginning to rotate clockwise, and the flexible arm portion 122 of the flex arm assembly 118 is shown in its substantially non-flexed state. The flexible arm portion 122 can flex either to its left or to its right, and thus, the bezel 102 can move to its left or to its right.

Turning to FIG. 5, the eccentric rotary mass has rotated further clockwise and is disposed mostly to the left of the haptic effect generator 110. Because the mass is positioned substantially to the left of the haptic effect generator 110, the haptic effect generator 110 causes the bezel 102 to move to the left of the figure. However, the flexible arm portion 122 elastically limits the movement of the bezel 102 to the left.

Turning to FIG. 6, the eccentric rotary mass has rotated further clockwise and is disposed mostly to the right of the haptic effect generator 110. Because the mass is positioned substantially to the right of the haptic effect generator 110, the haptic effect generator 110 causes the bezel 102 to move to the right of the figure. As before, the flexible arm portion 122 elastically limits the movement of the bezel 102 to the right. Further movement of the rotary mass returns it to substantially its original position, and the flexible arm portion 122 substantially returns the bezel 102 to its original position relative to the rear cover 112.

To manufacture the touch panel assembly with haptic effects, a first surface is provided. In the embodiment shown in the figures, the first surface is a surface of the bezel 102. Next, a second surface is provided, and a flexible arm portion 122 is disposed on the second surface. The flexible arm portion 122 can include a coupling portion 124. In the embodiment shown, the second surface is a surface of the rear cover 112. Then, a coupling couples the first surface with the second surface via the coupling portion 124. In the depicted embodiment, the coupling is a screw that extends through the coupling portion 124 of the rear cover 112 to a screw hole in the bezel 102. Next, a haptic effect generator 110 is disposed on one of the surfaces. In the embodiment shown, the haptic effect generator 110 is attached to the bezel 102 by a retainer bracket 108. The steps are described as being performed in a particular order, but the order in which these steps are performed is not important and other orders may be suitable.

Figure 7:
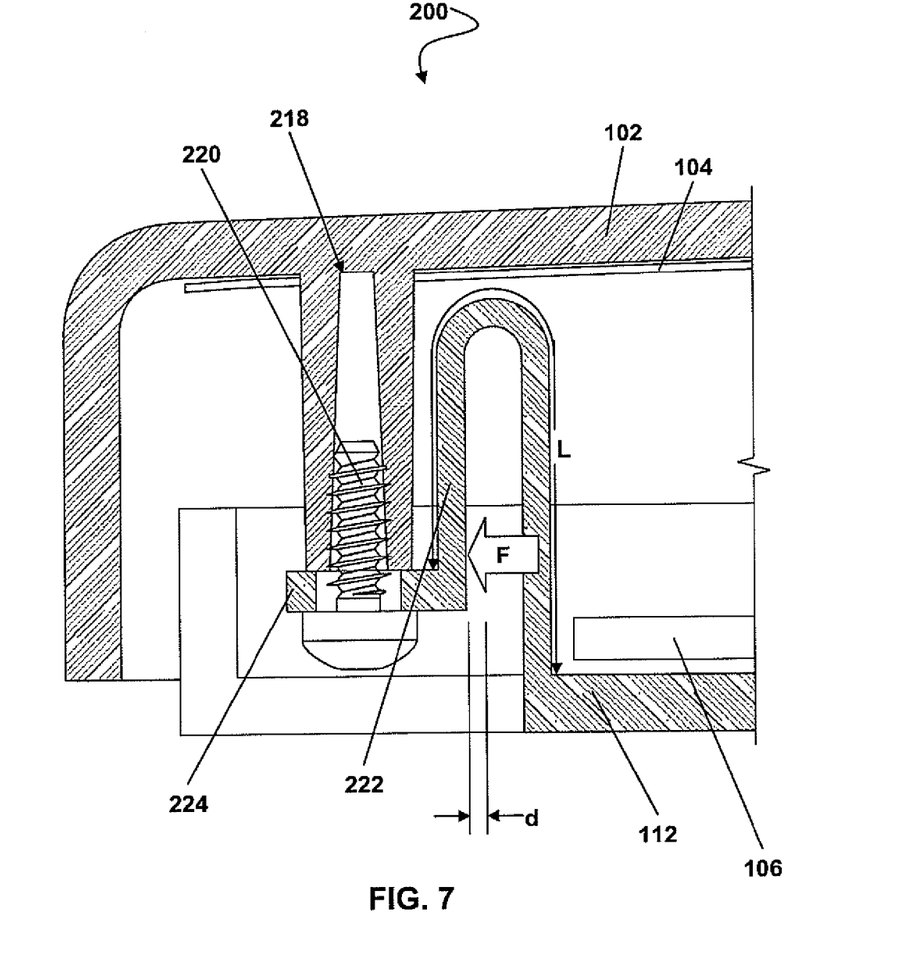
FIG. 7 is a partial sectional view in detail of a flex arm of a touch panel assembly according to another exemplary embodiment of the invention.

Referring to FIG. 7, another embodiment of the flex arm assembly 218 is shown. The flex arm assembly 218 includes a coupling 220, a flexible arm portion 222, and a coupling portion 224. The coupling 220 and the coupling portion 224 are substantially similar to the coupling 120 and the coupling portion 124, respectively, of the touch panel assembly 100. Thus, a detailed description of the coupling 220 and the coupling portion 224 are omitted. However, unlike the flexible arm portion 122, the flexible arm portion 222 includes a loop. The loop allows the geometry of the flexible arm portion 222 to be varied. For example, the length L can be varied.

Varying the geometry of the flexible arm portion 222 generally changes the elastic force F generated by the deflection d of the flexible arm portion 222. The force can be calculated with the following equations: k=F/d where F=(3dEI)/L³. In the equations, k is the spring constant; F is the force; d is the deflection of the flexible arm portion 222; E is modulus of elasticity of the material used for the flexible arm portion 222; L is the length of the flexible arm portion; I is the moment of inertia and can be calculated by the equation I=bh³/12 for a rectangular section. In the equation I=bh³/12, b is the beam width, i.e., the width of a section of the flexible arm portion 222, and h is the beam thickness, i.e., the height of a section of the flexible arm portion 222. Based on the equations above, length is a critical variable in determining the elastic force generated by the deflection of the flexible arm portion 222.

Figure 8:
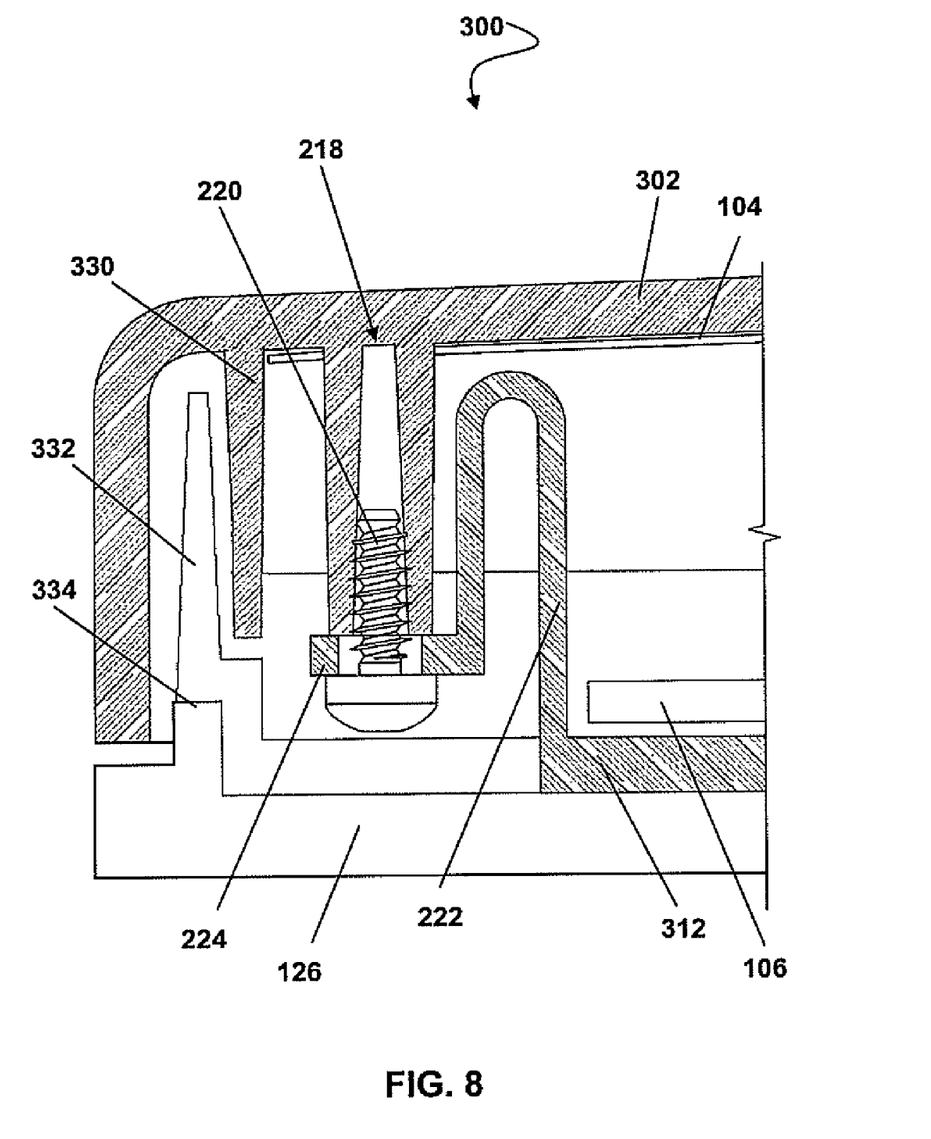
FIG. 8 is a partial sectional view in detail of a bezel and a rear cover of a touch panel assembly according to yet another exemplary embodiment of the invention.

Referring to FIG. 8, another embodiment of the bezel 302 and rear cover 312 is shown. The flex arm assembly 218 described above is also shown. The bezel 302 includes a first baffle 330, and the rear cover 312 includes a second baffle 332. The first baffle 330, the second baffle 332, or both substantially prevents debris or fluid intrusion into the touch panel assembly 300. The second baffle 332 can provided with a sealed seat 334 to provide further protection against debris and fluid. In the embodiment shown, the first baffle 330 is placed inward of the second baffle 332. Also, the first baffle 330 and the second baffle 332 are disposed substantially along the periphery of the bezel 302 and the rear cover 312, respectively.

Figure 9:
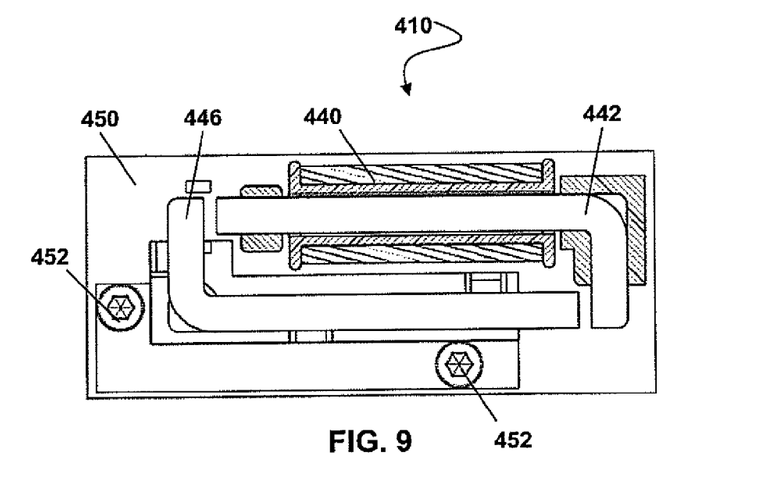
FIG. 9 is a plan view of an actuator of a touch panel assembly according to a further embodiment of the invention.

Referring to FIG. 9, an alternate embodiment of a haptic effect generator 410 is shown. Unlike the haptic effect generator 110 of the touch panel assembly 100, the haptic effect generator 410 includes an integrated electromagnetic linear actuator. A description of an electromagnetic linear actuator is described in U.S. patent application Ser. No. 11/969,071, filed Jan. 3, 2008, entitled "Haptic Actuator Assembly and Method of Manufacturing a Haptic Actuator Assembly" and is incorporated herein in its entirety by reference. In the embodiment depicted, the haptic effect generator 410 has, at least, a coil 440, a core 442, and a ferrous body 446. The coil 440 is made of an electrically conductive material wrapped around the core 442. The coil 440 produces a magnetic field when an electrical current is applied to the coil 440. The core 442 is made of a ferrous material or a material that is magnetized in the presence of a magnetic field. When an electrical current is applied to the coil 440, a magnetic field is developed in the coil 440, and the magnetic field causes the core 442 to be attracted magnetically to a nearby ferrous body 446.

Figure 10:
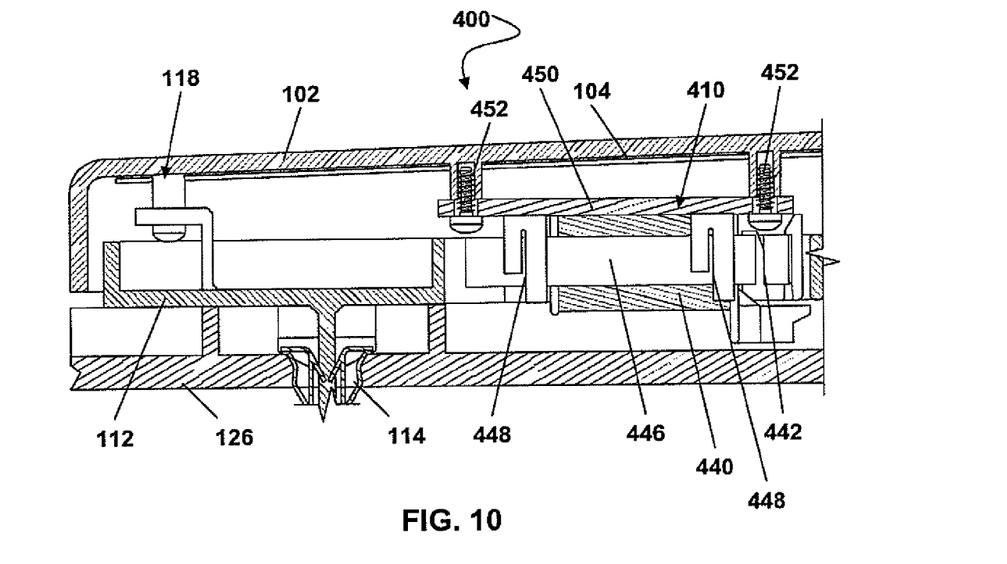
FIG. 10 is a partial sectional view in detail of the touch panel assembly according to a further embodiment of the invention.
Figure 11:
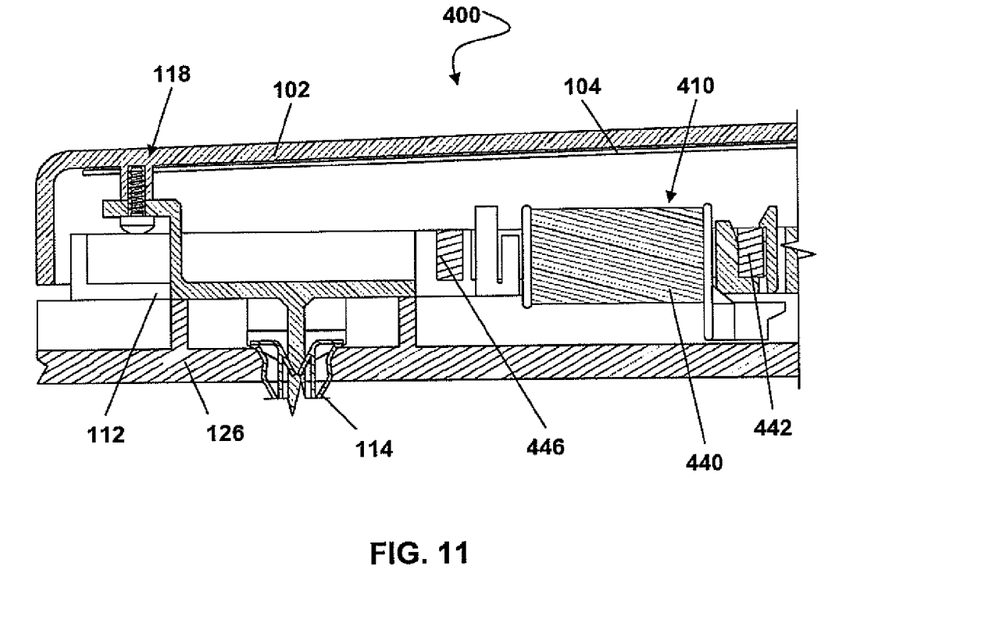
FIG. 11 is another partial sectional view in detail of the touch panel assembly illustrated in FIG. 10.

Referring to FIGS. 10 and 11, a touch panel assembly 400 is shown with the haptic effect generator 410 in different partial sectional views that show the arrangement of the coil 440, the core 442, and the ferrous body 446 relative to the bezel 102 and the rear cover 112. In the embodiment shown, the touch panel assembly 400 includes a bezel 102, a sensor circuit board 104, a rear cover 112, at least one mounting 114, and at least one flex arm assembly 118. Also, the touch panel assembly 400 is coupled to a structure 126. Turning to FIG. 10, the haptic effect generator 410 is shown in section so that most of the ferrous body 446 and a tip of the core 442 can be seen. The coil 440 and the core 442 are coupled to the rear cover 112, and the ferrous body 446 is coupled to the bezel 102. In the embodiment shown, the ferrous body 446 is held by supports 448 which are attached to a base 450, and the base 450 is attached to the bezel 102 by screws 452. Turning to FIG. 11, the coil 440 and the core 442 are shown in another partial sectional view wherein a portion of the ferrous body 446 and a portion of the core 442 are shown in section. The coil 440 and the core 442 are coupled to the rear cover 112.

Thus, when the ferrous body 446 moves towards the core 442 because of the magnetic field generated by the coil 440, the bezel 102 moves with the ferrous body 446, and the bezel 102 moves relative to the rear cover 112. When the magnetic field collapses, the flex arm assembly 118 pulls the ferrous body 446 away from the core 442, and thus, the bezel 102 returns to substantially its original position before it moved.

As apparent from the above description, the invention provides a touch panel assembly 100 with haptic effects and a method of manufacturing the touch panel assembly 100 with haptic effects. At least one haptic effect generator 110 and at least one flexible arm portion 122 are coupled to the touch panel assembly 100 so that a slight movement is imparted to the bezel 102 in response to the user manipulating an input device 116 disposed on the bezel 102. Thus, the haptic effect generator 110 and the flexible arm portion 122 provide a system with haptic feedback at reduced cost, with simpler manufacturing requirements at lower cost, and with reduced premature component failure.

While a particular embodiment has been chosen to illustrate the invention, it will be understood by those skilled in the art that various changes and modifications can be made therein without departing from the scope of the invention as defined in the appended claims.

What is claimed is:

1. A system with haptic effects, the system comprising:
   a first surface;
   a second surface with a flexible arm portion, the flexible arm portion including a coupling portion;
   a coupling received by the coupling portion that couples the flexible arm portion of the second surface to the first surface; and
   a haptic effect generator coupled exclusively to the first surface, the haptic effect generator causing inertial movement of the first surface relative to the second surface,
   wherein the flexible arm portion limits the movement of the first surface and elastically returns the first surface substantially to an original position of the first surface relative to the second surface.

2. A system according to claim 1, wherein the first surface is a surface of a bezel.

3. A system according to claim 1, wherein the haptic effect generator includes an eccentric rotary mass.

4. A system according to claim 1, wherein the haptic effect generator includes a linear actuator.

5. A system according to claim 1, further comprising an input device disposed opposite the first surface.

6. A system according to claim 1, further comprising a sensor circuit board.

7. A system according to claim 1, further comprising an interface sensor circuit board.

8. A method of manufacturing a system with haptic effects, the method comprising the steps of:
   providing a first surface;
   disposing a haptic effect generator on the first surface, wherein the haptic effect generator is coupled exclusively to the first surface;
   providing a second surface;
   disposing a flexible arm portion on the second surface;
   disposing a coupling portion on the flexible arm portion; and
   coupling the coupling portion to the first surface, such that the flexible arm portion is the exclusive means of attachment between the first surface and the second surface.

9. A method according to claim 8,
   wherein the first surface is a surface of a bezel.

10. A method according to claim 8, further comprising the step of disposing an input device on the first surface.

11. A method according to claim 8, further comprising the step of disposing a sensor circuit board adjacent the first surface.

12. A method according to claim 8, further comprising the step of disposing an interface circuit board adjacent the second surface.

13. A method according to claim 8, further comprising the step of disposing an eccentric rotary mass in the haptic effect generator.

14. A method according to claim 8, further comprising the step of disposing a linear actuator in the haptic effect generator.

* * * * *